US011112297B2

(12) United States Patent
Yoon et al.

(10) Patent No.: US 11,112,297 B2
(45) Date of Patent: Sep. 7, 2021

(54) RESONATOR AND RESONATOR SYSTEM INCLUDING THE SAME AND METHOD OF MANUFACTURING THE RESONATOR

(71) Applicant: SAMSUNG ELECTRONICS CO., LTD., Suwon-si (KR)

(72) Inventors: Yongseop Yoon, Seoul (KR); Sungchan Kang, Hwaseong-si (KR); Cheheung Kim, Yongin-si (KR); Choongho Rhee, Anyang-si (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 16/398,449

(22) Filed: Apr. 30, 2019

(65) Prior Publication Data

US 2020/0158564 A1 May 21, 2020

(30) Foreign Application Priority Data

Nov. 20, 2018 (KR) .................. 10-2018-0143903

(51) Int. Cl.
  *G01H 11/08* (2006.01)
  *H01L 41/25* (2013.01)
  *H01L 41/113* (2006.01)
(52) U.S. Cl.
  CPC .......... *G01H 11/08* (2013.01); *H01L 41/1132* (2013.01); *H01L 41/1136* (2013.01); *H01L 41/25* (2013.01)

(58) Field of Classification Search
  CPC .......... G01H 11/08; G01H 11/06; G01H 1/06; G01H 1/14; G01N 29/036; G01N 29/022; H01L 41/1132; H01L 41/1136; H01L 41/25
  See application file for complete search history.

(56) References Cited

U.S. PATENT DOCUMENTS

| 5,049,775 | A | * | 9/1991 | Smits | .................. | H01L 41/0946 310/328 |
| 6,079,274 | A | * | 6/2000 | Ando | .................. | G01H 1/06 310/321 |
| 6,249,073 | B1 | * | 6/2001 | Nguyen | .................. | H03H 3/0078 310/309 |
| 6,438,243 | B1 | * | 8/2002 | Ikeuchi | .................. | H04R 15/02 367/181 |
| 8,169,124 | B2 | * | 5/2012 | Lee | .................. | G01N 29/036 310/331 |
| 8,334,736 | B2 | | 12/2012 | Kaajakari | | |
| 10,178,482 | B2 | * | 1/2019 | Yang | .................. | H04R 25/554 |
| 2006/0219016 | A1 | * | 10/2006 | Wang | .................. | G01H 1/00 73/652 |

(Continued)

FOREIGN PATENT DOCUMENTS

KR  10-2013-0107748 A  10/2013

*Primary Examiner* — Helen C Kwok
(74) *Attorney, Agent, or Firm* — Sughrue Mion, PLLC

(57) ABSTRACT

Provided are resonators, a resonator system including the resonators, and a method of manufacturing the resonators. The resonator includes a vibration beam configured to vibrate in response to an external signal, a sensing unit configured to detect the movement of the vibration beam, and a lumped mass unit including a base unit that contacts the vibration beam and a wing unit arranged separately from the vibration beam on the base unit.

16 Claims, 16 Drawing Sheets

(56) References Cited

U.S. PATENT DOCUMENTS

| | | | |
|---|---|---|---|
| 2007/0169553 A1* | 7/2007 | Mutharasan | H01L 41/1132 |
| | | | 73/579 |
| 2018/0131346 A1 | 5/2018 | Kagayama et al. | |
| 2018/0138886 A1 | 5/2018 | Yoon et al. | |
| 2019/0028084 A1 | 1/2019 | Yoon et al. | |

* cited by examiner

FIG. 8
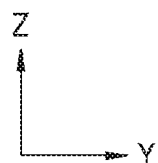
FIG. 9
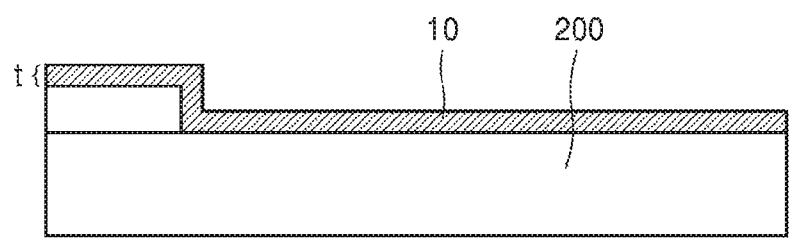
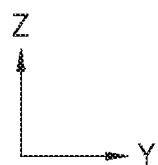

FIG. 10
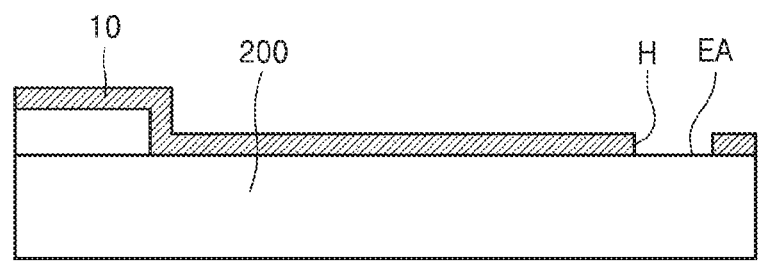
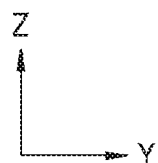
FIG. 11
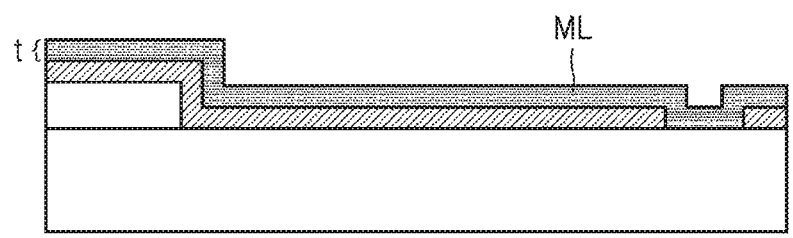
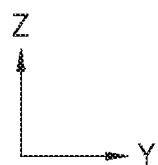

FIG. 12
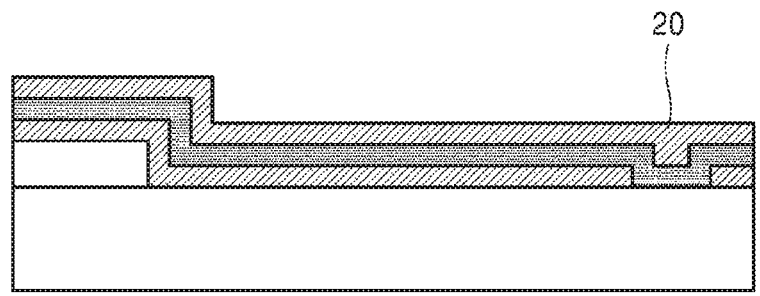
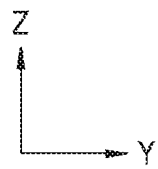
FIG. 13
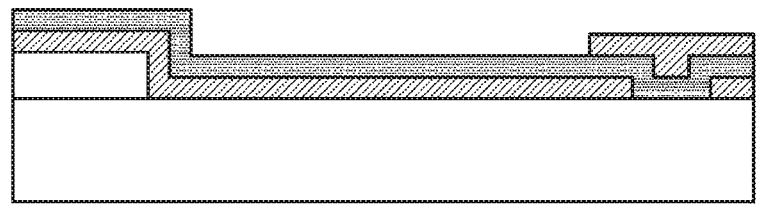
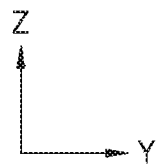

FIG. 14
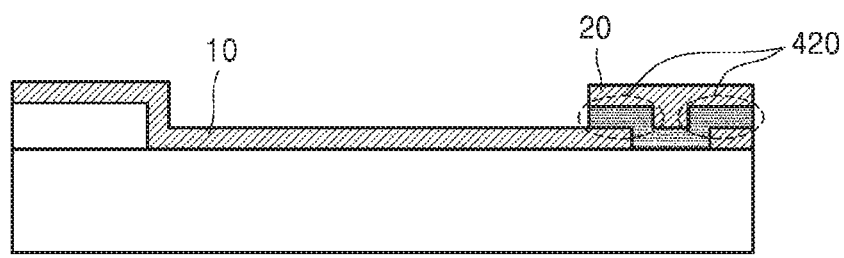
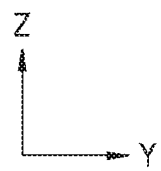
FIG. 15
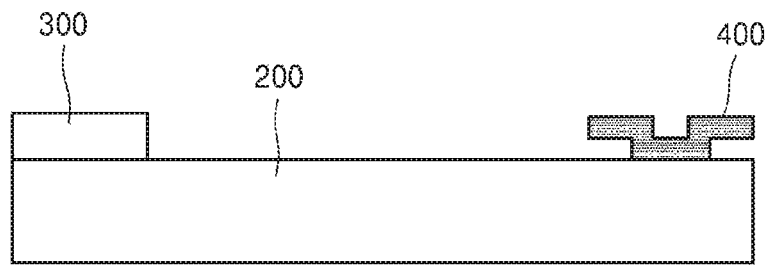
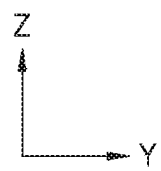

FIG. 16
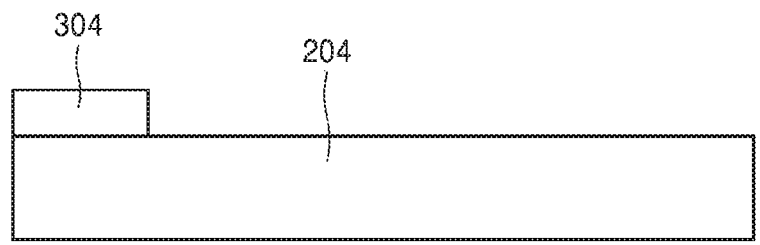
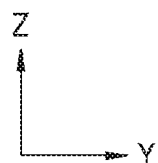
FIG. 17
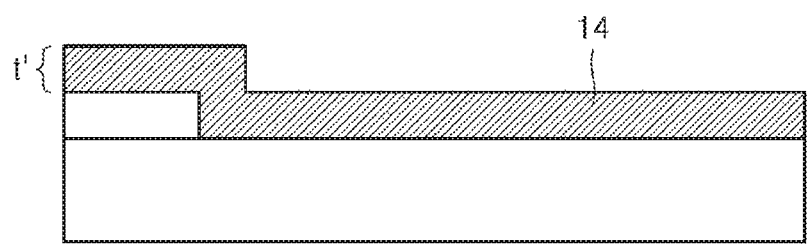
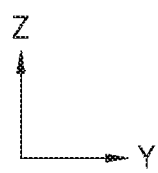

FIG. 18
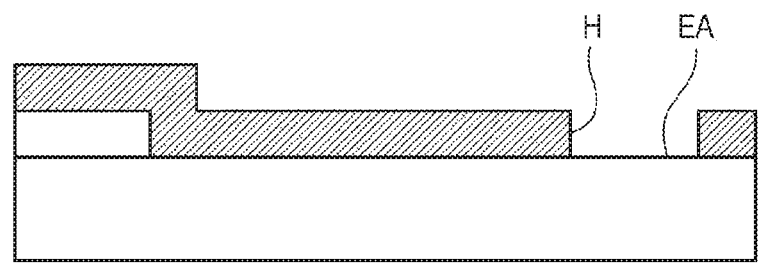
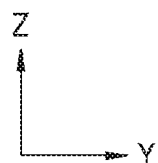
FIG. 19
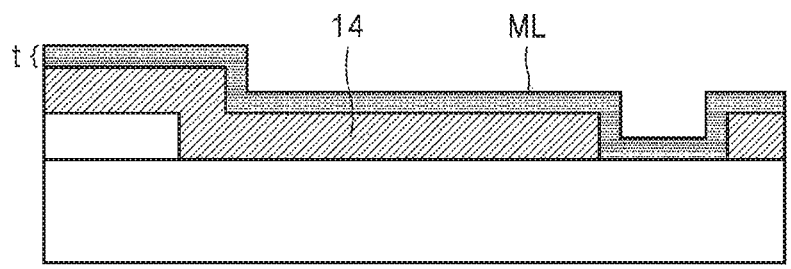
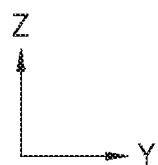

FIG. 20
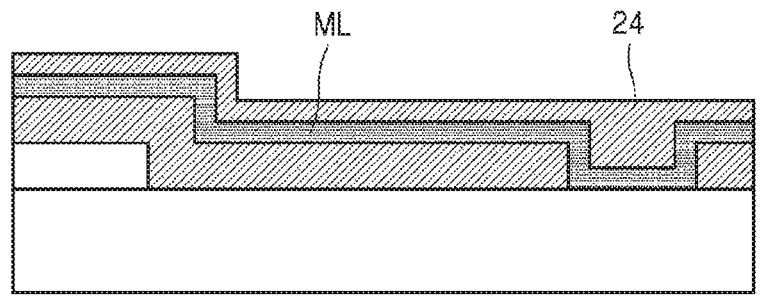
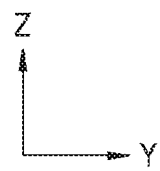
FIG. 21
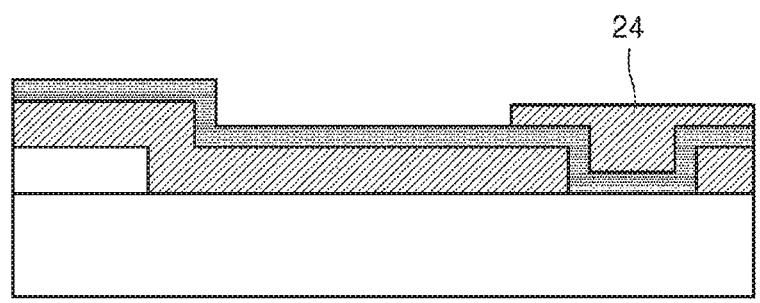
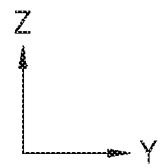

FIG. 22
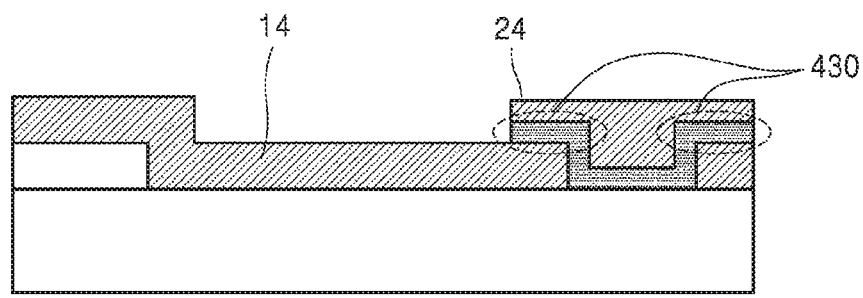
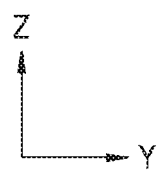
FIG. 23
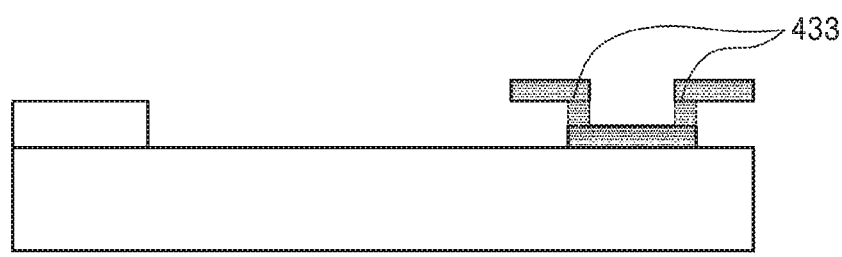
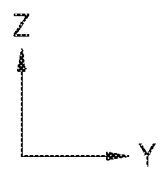

RESONATOR AND RESONATOR SYSTEM INCLUDING THE SAME AND METHOD OF MANUFACTURING THE RESONATOR

CROSS-REFERENCE TO RELATED APPLICATION

This application claims priority under 35 U.S.C. § 119 to Korean Patent Application No. 10-2018-0143903, filed on Nov. 20, 2018, in the Korean Intellectual Property Office, the disclosure of which is incorporated herein in its entirety by reference.

BACKGROUND

1. Field

Example embodiments of the present disclosure relate to resonators and resonator systems including the same and methods of manufacturing the resonators.

2. Description of the Related Art

A resonator for analyzing an acoustic characteristic or a vibration characteristic mainly uses a beam of a cantilever. In a cantilever structure, one side of the cantilever vibrates while the other side is fixed on a supporting unit.

A resonator may be used for analyzing a sound or voice information in mobile electronic devices or automobiles. Also, the resonator may measure bio information by being attached to human skin or may measure vibration information by being mounted on automobiles or home appliances.

Resonators may have different structures according to required frequency characteristics. For example, in order to ensure a low frequency characteristic of the resonator such that the resonator is capable of sensing a low frequency, a length of the resonator may be increased. However, when the length of the resonator increases, the size of a whole system may be increased, and also, the rigidity of the resonator may be reduced, and thus, the reliability of the resonator is reduced.

SUMMARY

Example embodiments provide resonators that may reduce manufacturing cost and have a low frequency characteristic and high detecting sensitivity, a resonator system including the resonators, and methods of manufacturing the resonators.

Additional aspects will be set forth in part in the description which follows and, in part, will be apparent from the description, or may be learned by practice of the presented embodiments. In accordance with an aspect of an example embodiment, a resonator includes a vibration beam configured to vibrate in response to an external signal, an edge of the vibration beam being fixed on a supporting member, the vibration beam extending in a first direction; a sensing unit arranged on the vibration beam to detect movement of the vibration beam; and a lumped mass unit arranged on the vibration beam, the lumped mass unit including a base unit contacting the vibration beam; and a wing unit arranged on the base unit, the wing unit being separated from the vibration beam.

The vibration beam may contact the base unit without contacting any other portion of the lumped mass unit.

The wing unit and the base unit may have a same thickness.

A size and a shape of the wing unit may be determined so that a total volume of the lumped mass unit is greater than a product of a cross-sectional area of a region of contact between the base unit and the vibration beam and the thickness of the base unit.

The lumped mass unit may further include a connection unit that connects the base unit to the wing unit.

The wing unit may include a first wing extending in the first direction from an edge of the base unit, and a distance from an edge of the first wing to the supporting member may be greater than a distance from the edge of the base unit to the supporting member.

A length of the first wing in the first direction may be greater than a length of the base unit in the first direction.

The wing unit may further include a second wing extending in the first direction from another edge of the base unit, and a distance from an edge of the second wing to the supporting member may be less than a distance from the other edge of the base unit to the supporting member.

The first wing and the second wing may have a same length in the first direction, and the first wing, the second wing, and the base unit may have a same width in a second direction perpendicular to the first direction and to a thickness direction.

Widths of the first wing and the second wing in a second direction may be greater than a width of the base unit in the second direction, the second direction being perpendicular to the first direction and to the thickness direction.

The sensing unit may include a piezoelectric material.

In accordance with an aspect of an example embodiment, a resonator system includes a first resonator including a first vibration beam; a first sensing unit configured to detect movement of the first vibration beam; and a first lumped mass unit comprising a first base unit contacting the first vibration beam and a first wing unit arranged on the first base unit, the first wing unit being separated from the second vibration beam; a second resonator including a second vibration beam; a second sensing unit configured to detect movement of the second vibration beam; and a second lumped mass unit comprising a second base unit contacting the second vibration beam and a second wing unit arranged on the second base unit, the second wing unit being separated from the second vibration beam; and a processor configured to process signals detected from the first and second resonators.

The first vibration beam and the second vibration beam may have different lengths.

The first lumped mass unit and the second lumped mass unit may have different masses.

The first wing unit may include a first wing extending in a direction away from the first base unit from an edge of the first base unit, and the second wing unit may include a second wing extending in a direction away from the second base unit from an edge of the second base unit.

The first wing unit and the first base unit may have a same first thickness, and the second wing unit and the second base unit have same second thickness.

In accordance with an aspect of an example embodiment, a method of manufacturing a resonator includes forming a vibration beam so that one end is fixed on a supporting member and the other end extends in a direction away from the one end; forming a sensing unit configured to detect the movement of the vibration beam on the vibration beam; and forming a lumped mass unit including a base unit, the base unit contacting the vibration beam, and a wing unit arranged on the base unit, the wing unit being separated from the vibration beam.

The wing unit and the base unit may have a same thickness.

The forming of the lumped mass unit may include forming a photoresist layer covering the sensing unit and the vibration beam; forming a hole in the photoresist layer by patterning the photoresist layer, the hole having a same cross-sectional shape as the base unit; forming a metal layer covering the photoresist layer and the hole; and patterning the metal layer into a shape of the wing unit.

The photoresist layer may have a thickness different from that of the base unit.

BRIEF DESCRIPTION OF THE DRAWINGS

The above and other aspects will become apparent and more readily appreciated from the following description of example embodiments, taken in conjunction with the accompanying drawings, in which:

FIGS. 8 through 15 are schematic cross-sectional views illustrating a method of manufacturing the resonator of FIG. 1 according to an example embodiment;

FIGS. 16 through 23 are schematic cross-sectional views illustrating a method of manufacturing the resonator of FIG. 5 according to an example embodiment.

DETAILED DESCRIPTION

Figure 1:
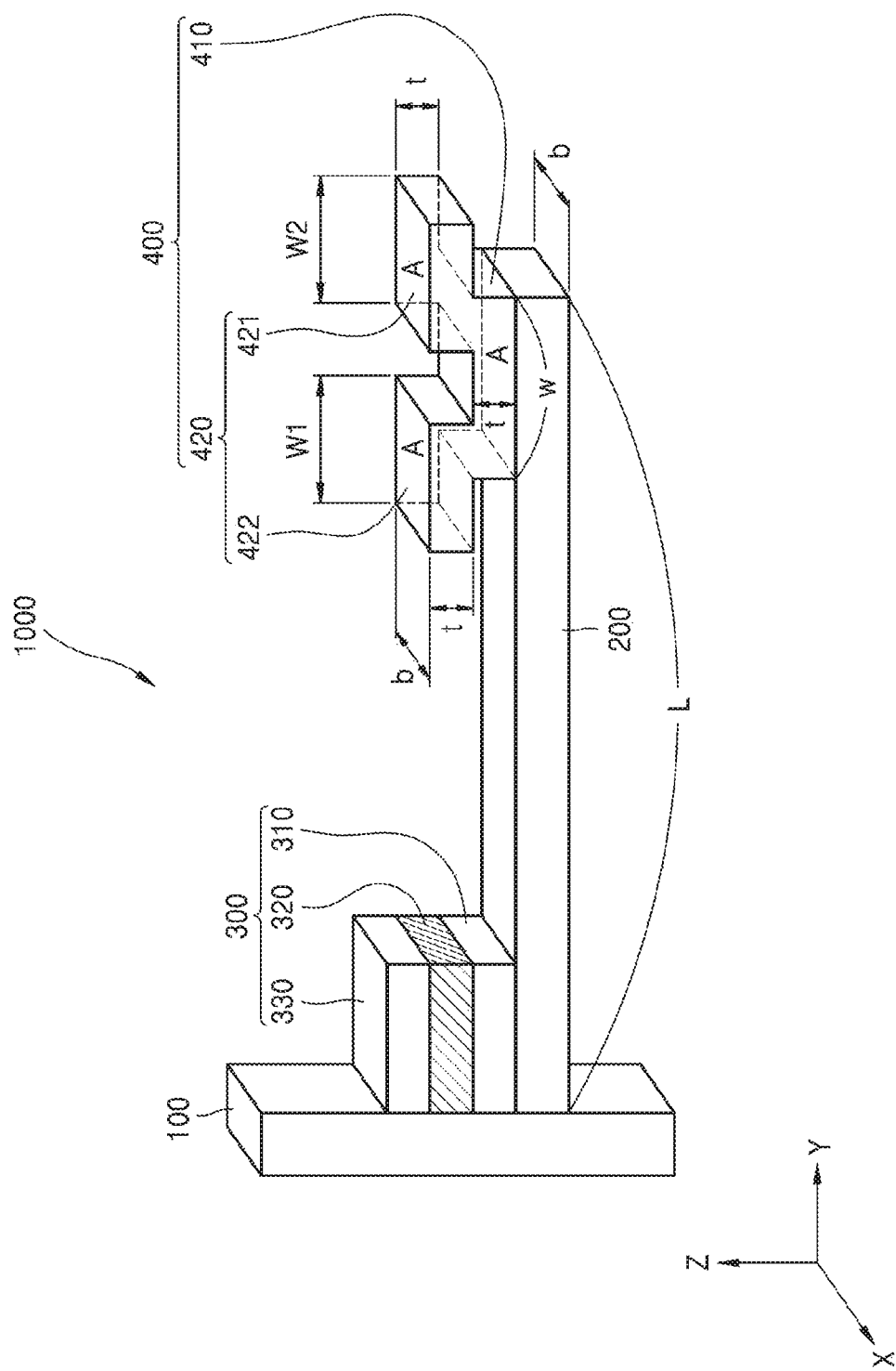
FIG. 1 is a schematic perspective view of a resonator according to an example embodiment.

Resonators according to various example embodiments, a resonator system including the resonators, and a method of manufacturing the resonator will now be described in detail with reference to the accompanying drawings. In the drawings, like reference numerals refer to like elements throughout, and sizes and thicknesses of constituent elements may be exaggerated for clarity of explanation.

It will be understood that, although the terms 'first', 'second', etc. may be used herein to describe various elements, these elements should not be limited by these terms. These terms are only used to distinguish one element from another. The resonator, the resonator system including the resonator, and the method of manufacturing the resonator may be realized in different forms and should not be construed as being limited to the descriptions set forth herein.

It should be understood that, when a part "comprises" or "includes" an element in the specification, unless otherwise defined, it is not excluding other elements but may further include other elements.

FIG. 1 is a schematic perspective view of a resonator 1000 according to an example embodiment.

Referring to FIG. 1, the resonator 1000 includes a vibration beam 200 fixed on a supporting member 100 and a sensing unit 300 and a lumped mass unit 400 arranged on the vibration beam 200. The vibration beam 200 vibrates in response to an external signal, and an edge of the vibration beam 200 is fixed on the supporting member 100. The vibration beam 200 may extend in a first direction (for example, a Y-axis direction as shown in FIG. 1). The sensing unit 300 is arranged on the vibration beam 200 and may detect the movement of the vibration beam 200. The lumped mass unit 400 may include a base unit 410 that contacts the vibration beam 200 and a wing unit 420 separately arranged from the vibration beam 200 on the base unit 410. The resonator 1000 may be a mechanical resonator configured to obtain information regarding a physical stimulation applied to the vibration beam 200 by analyzing the movement of the vibration beam 200.

The supporting member 100 may be a member formed on mobile electronic devices (for example, mobile phones) or automobiles.

The vibration beam 200 may have a beam shape and may be referred to as a cantilever. An external stimulation (for example, a sound) may vibrate the vibration beam 200. In this case, the resonant frequency fn of the vibration beam 200 may be given as the following equation.

$$f_n = \frac{1}{2\pi}\sqrt{\frac{k}{M}} \qquad \text{[Equation 1]}$$

In the above equation, M indicates a mass of the lumped mass unit 400. k is a constant indicating beam stiffness of the vibration beam 200. k is inversely proportional to the cube of the length L of the vibration beam 200. Accordingly, as the length L of the vibration beam 200 increases, the resonant frequency fn decreases, and thus, a longer vibration beam 200 may be sensitive to a lower frequency. However, when the length L of the vibration beam 200 is increased to correspond to the lower resonant frequency, the size of a device is increased and the rigidity of the device is reduced, and thus, the reliability of the resonator 1000 may be reduced.

The vibration beam 200 may have a width b in a range from about a few tens of μm to about a few hundreds of μm. The vibration beam 200 may include silicon that is generally used in a semiconductor process. However, the present embodiment is not limited thereto, and the vibration beam 200 may include glass, silicon oxide ($SiO_2$), silicon nitride (SiN), etc.

The sensing unit 300 may include a structure in which a lower electrode layer 310, a piezoelectric layer 320, and an upper electrode layer 330 are sequentially stacked. The sensing unit 300 may detect the movement of the vibration beam 200. For example, when an external physical stimulation (for example, a sound) is applied to the lumped mass unit 400 arranged on the vibration beam 200, a force acts on the lumped mass unit 400, and accordingly, a torque is generated at the sensing unit 300. A charge is generated in the piezoelectric layer 320 in proportion to the magnitude of the torque, and accordingly, a voltage is generated in inverse proportion to an electrostatic capacitance between the upper electrode layer 330 and the lower electrode layer 310. As a result, the resonator 1000 may obtain information regarding a physical stimulation by detecting and analyzing a voltage generated in the sensing unit 300 by an external physical stimulation from the outside of the resonator 1000.

The lower electrode layer 310 and the upper electrode layer 330 may include a metal material, such as molybdenum (Mo). The piezoelectric layer 320 may include any piezoelectric material that may be used in a piezo-sensor. For example, the piezoelectric layer 320 may include AlN, ZnO, SnO, PZT, ZnSnO$_3$, polyvinylidene fluoride (PVDF), poly(vinylidene fluoride-trifluoroethylene) (P(VDF-TrFE)), or PMN-PT. An insulating layer (not shown) may further be selectively formed between the lower electrode layer 310 and the vibration beam 200.

The shape of the lumped mass unit 400 may minimize a thickness of the resonator 1000 while maintaining a required performance. Accordingly, the lumped mass unit 400 may have a double layer structure having the base unit 410 and the wing unit 420 arranged on the base unit 410. As depicted in FIG. 1, a cross-sectional area at which the base unit 410 contacts the vibration beam 200 and a cross-sectional area at which the lumped mass unit 400 contacts the vibration beam 200 are equal to each other as A. That is, the wing unit 420 does not contact the vibration beam 200. The lumped mass unit 400 employs the base unit 410 that has a thickness t and a contact area with the vibration beam 200 is A=w·t, where w is a length of the contact area between the base unit 410 and the vibration beam 200. Also, the lumped mass unit 400 includes the wing unit 420 having a shape not in contact with the vibration beam 200 so that a total volume is greater than A·t while the cross-sectional area that contacts the vibration beam 200 is maintained as A.

The wing unit 420 is arranged on the base unit 410, and thus, is configured to be separated from the vibration beam 200. For example, the wing unit 420 may include a first wing 421 extending in a direction away from the supporting member 100 from an edge of the base unit 410 and a second wing 422 extending in a direction toward the supporting member 100 from an edge of the base unit 410. In this way, the first wing 421 and the second wing 422 respectively extend in opposite directions from opposite edges of the base unit 410, and thus, the first wing 421 and the second wing 422 may be separated from each other.

The first wing 421 and the second wing 422 may have the same shape as the base unit 410. For example, the first wing 421 may have a rectangular parallelepiped shape with a length W2 in a first direction (the Y-axis direction as shown in FIG. 1) and the second wing 422 may have a rectangular parallelepiped shape with a length W1 in a first direction (the Y-axis direction as shown in FIG. 1). A thickness of the first wing 421 and the second wing 422 is t, and a width of the first wing 421 and the second wing 422 is b in a second direction (an X-axis direction as shown in FIG. 1) which is perpendicular to both the first direction (the Y-axis direction) and a thickness direction. Accordingly, a volume of each of the first wing 421 and the second wing 422 may be A·t. However, the present embodiment is not limited thereto, that is, the shape of the first wing 421 and the second wing 422 may be different from that of the base unit 410 and may be different from each other.

Also, the length W2 of the first wing 421 in the first direction (the Y-axis direction) and the length W1 of the second wing 422 in the first direction (the Y-axis direction) may be equal. However, the present embodiment is not limited thereto, that is, the length W2 of the first wing 421 in the first direction (the Y-axis direction) and the length W1 of the second wing 422 in the first direction (the Y-axis direction) may be different from each other.

Figure 2:
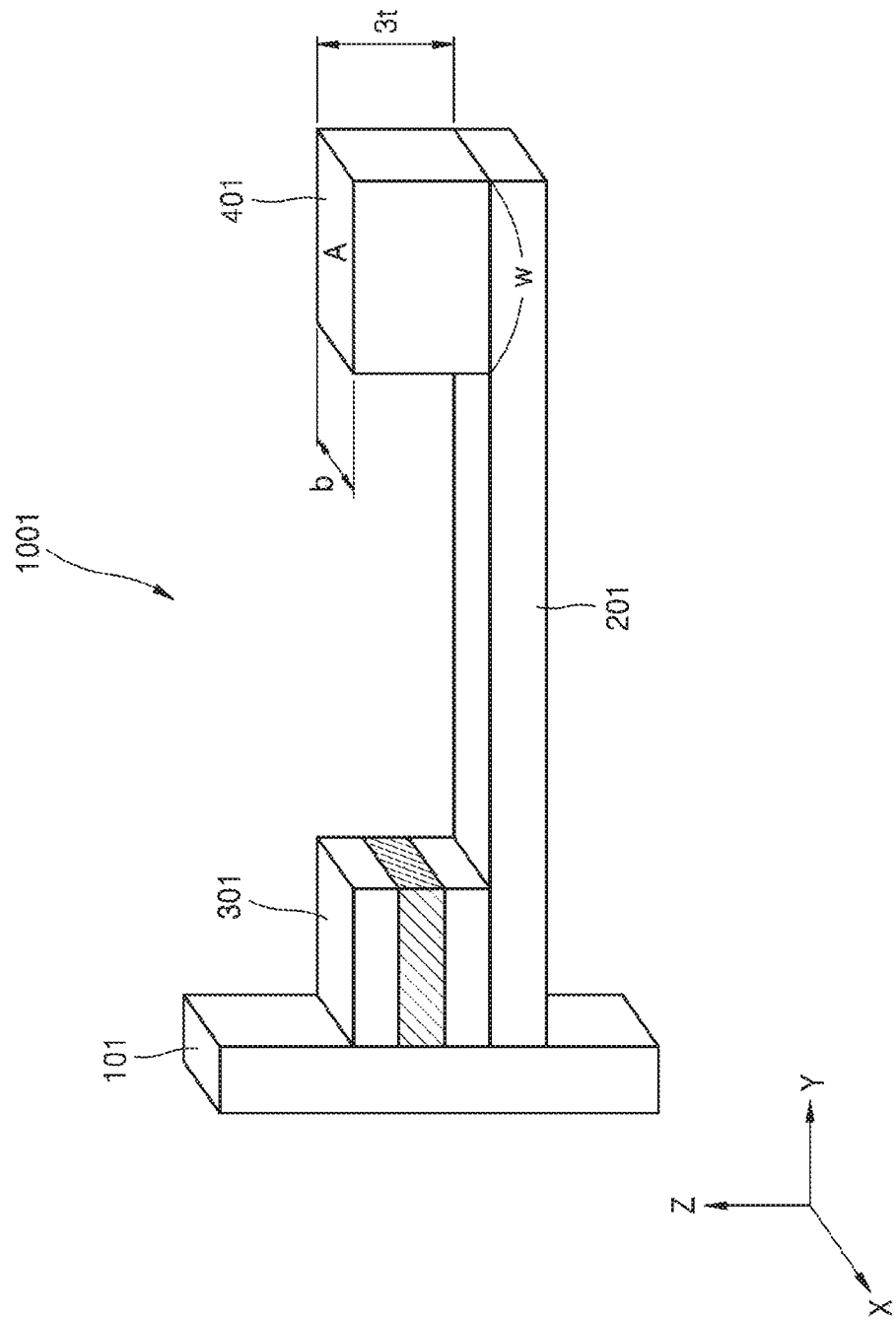
FIG. 2 is a schematic perspective view of a resonator according to a comparative example.
Figure 3:
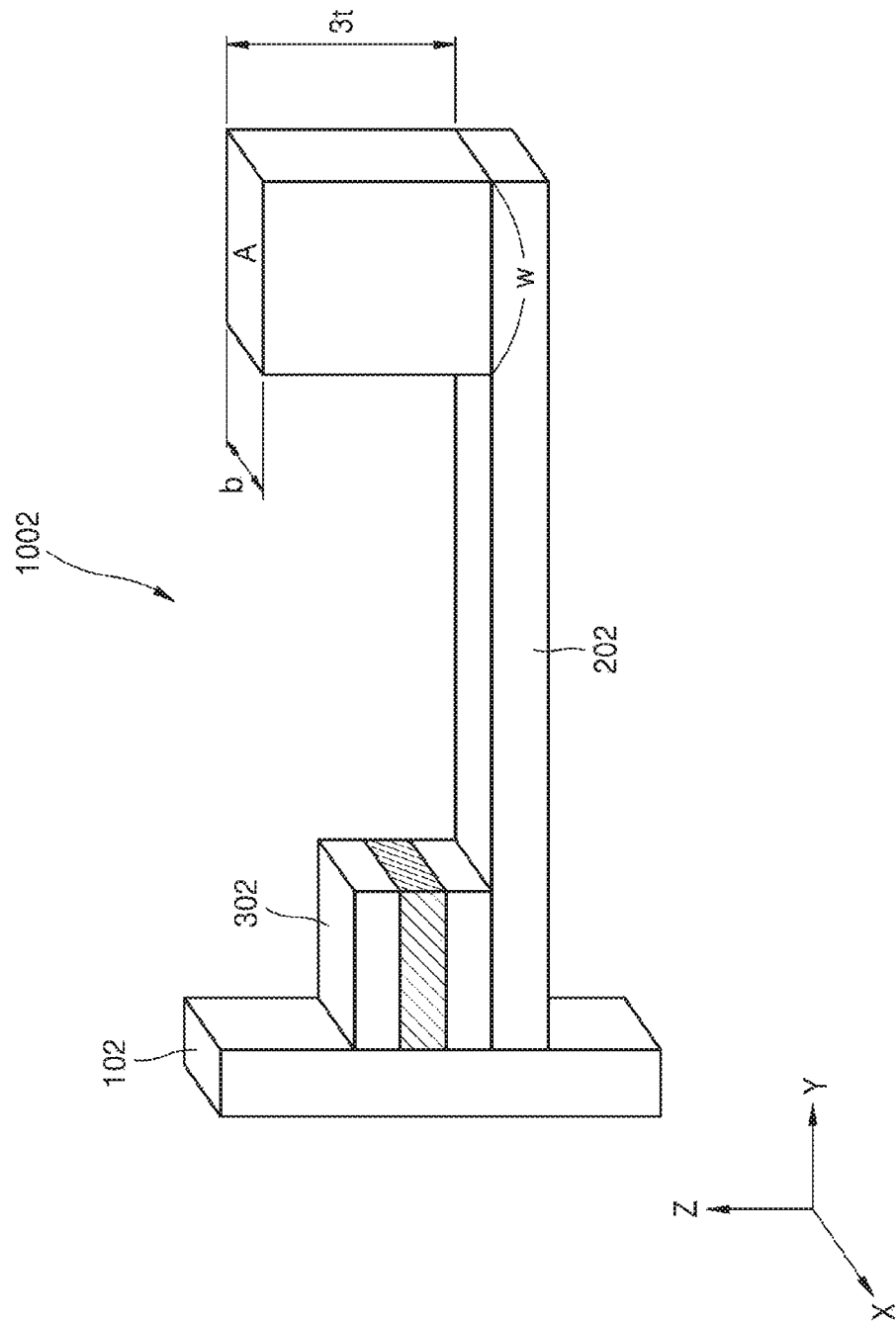
FIG. 3 is a schematic perspective view of a resonator according to a comparative example.
Figure 4:
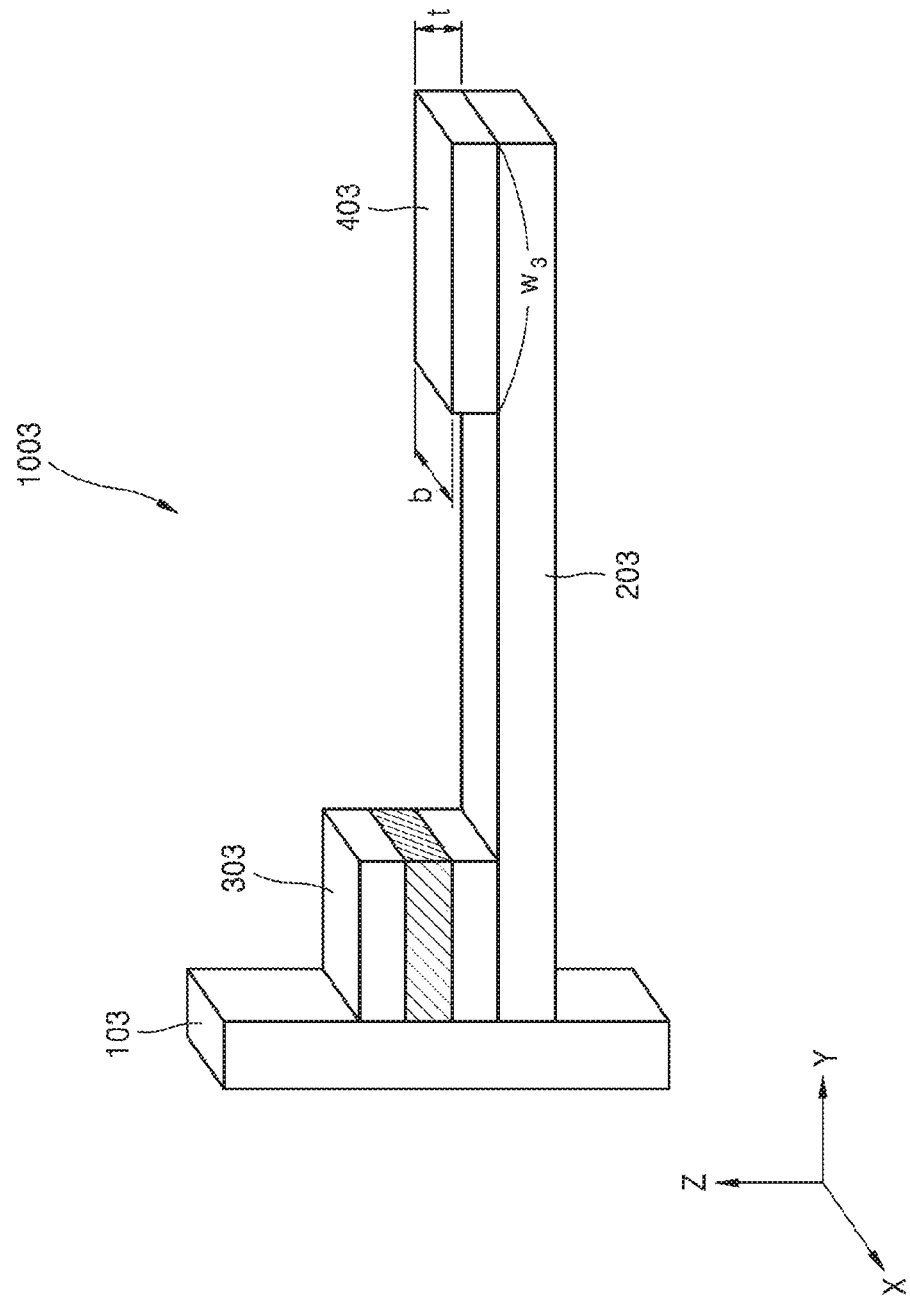
FIG. 4 is a schematic perspective view of a resonator according to a comparative example.

FIG. 2 is a schematic perspective view of the resonator 1001 according to a comparative example. FIG. 3 is a schematic perspective view of the resonator 1002 according to another comparative example. FIG. 4 is a schematic perspective view of the resonator 1003 according to another comparative example.

A volume of a lumped mass unit 401 of FIG. 2 is equal to the volume of the lumped mass unit 400 of FIG. 1 as 3 A·t. However, when FIG. 1 and FIG. 2 are compared, in the case of FIG. 2, the material cost may be increased due to the increase in a deposition thickness of the lumped mass unit 401 in a manufacturing process. FIGS. 3 and 4 show resonators 1002 and 1003 respectively including lumped mass units 402 and 403 having masses greater than that of the lumped mass unit 401 of FIG. 2 to reduce a resonant frequency of the resonator 1001 of FIG. 2. However, in the case of the resonator 1002 of FIG. 3, the material cost may be increased due to the increase in the deposition thickness of the lumped mass unit 402 in the manufacturing process. Also, in the case of the resonator 1003 of FIG. 4, an acting point of a physical stimulation that acts upon the lumped mass unit 403 (i.e., the center of mass of the lumped mass unit 403) is moved closer to a supporting member 103, and thus, the torque produced in the sensing unit 303 is reduced, thereby reducing the sensitivity of the resonator 1003.

Referring to FIG. 2, the resonator 1001 may be identical to the resonator 1000 of FIG. 1 except for the lumped mass unit 401. The lumped mass unit 401 does not have a double layer structure, but instead has a single layer structure having a rectangular parallelepiped shape in which an area of a bottom surface is A. also, a thickness of the lumped mass unit 401 is 3·t, and accordingly, a volume may be 3·A·t. In this way, the volume of the lumped mass unit 401 may be equal to that of the lumped mass unit 400 of FIG. 1 as 3·A·t, but the thickness of the lumped mass unit 401 is 3·t, which may be greater than the thickness t each of the base unit 410 and the wing unit 420.

As described above, a resonant frequency of a vibration beam 201 may be reduced when a length L of the vibration beam 201 is increased. However, when the resonant frequency is reduced by increasing the length L of the vibration beam 201 to ensure a low frequency characteristic of the resonator 1001, the rigidity of the vibration beam 201 may be reduced. As a method of ensuring the low frequency characteristic of the resonator 1001 while preventing the reduction of the rigidity of the vibration beam 201, the mass of the lumped mass unit 401 may be increased.

Referring to FIG. 3, as a method of increasing the mass of the lumped mass unit 401 of FIG. 2, the deposition thickness of the lumped mass unit 401 may be increased. For example, a thickness of the lumped mass unit 402 of FIG. 3 is 5 t and a volume may be 5·A·t. Thus, since the thickness of the lumped mass unit 402 of FIG. 3 is greater than that of the lumped mass unit 401 of FIG. 2, the mass of the lumped mass unit 402 of FIG. 3 may greater than that of the lumped mass unit 401 of FIG. 2. However, due to the nature of the manufacturing process (described below), there are technical and cost limitations in increasing the deposition thickness in the vibration beam 200 having a micro structure and a width in a range from about a few tens of μm to about a few hundreds of μm.

Referring to FIG. 4, as a method of increasing the mass of the lumped mass unit 402 of FIG. 2, the length of the lumped mass unit 402 may be increased in the first direction (the Y-axis direction) and may be deposited with a small thickness. For example, a thickness of the lumped mass unit 403 may be t, and a length of the lumped mass unit 403 in the first direction (the Y-axis direction) may be W3, which is greater than W. Accordingly, a volume of the lumped mass unit 403 may be B=W3·b·t, which is greater than A·t. A mass of the lumped mass unit 403 of FIG. 4 may be greater than that of the lumped mass unit 401 of FIG. 2. However, because the length of the lumped mass unit 403 is increased in the first direction, an acting point of an external force onto the lumped mass unit 403 (i.e., the center of mass of the lumped mass unit 403) is moved closer to the supporting member 103, and thus, a torque produced in the sensing unit 303 is reduced. The reduced torque may reduce the sensitivity of the resonator 1003.

Referring to FIG. 1, the lumped mass unit 400 of the resonator 1000 may include the base unit 410 having a thickness t, and the wing unit 420 including the first wing 421 and the second wing 422. In this way, since the resonator 1000 employs a double layer structure, when the lumped mass unit 400 is compared to the lumped mass unit 401 of FIG. 2, the length W of a portion of the lumped mass unit 400 that contacts the vibration beam 200 in the first direction is equal to the length of the lumped mass unit 401, and thus, there is no reduction of torque, and the mass may further be increased according to various shapes of the wing unit 420 without increasing the deposition thickness of the lumped mass unit 400.

Figure 5:
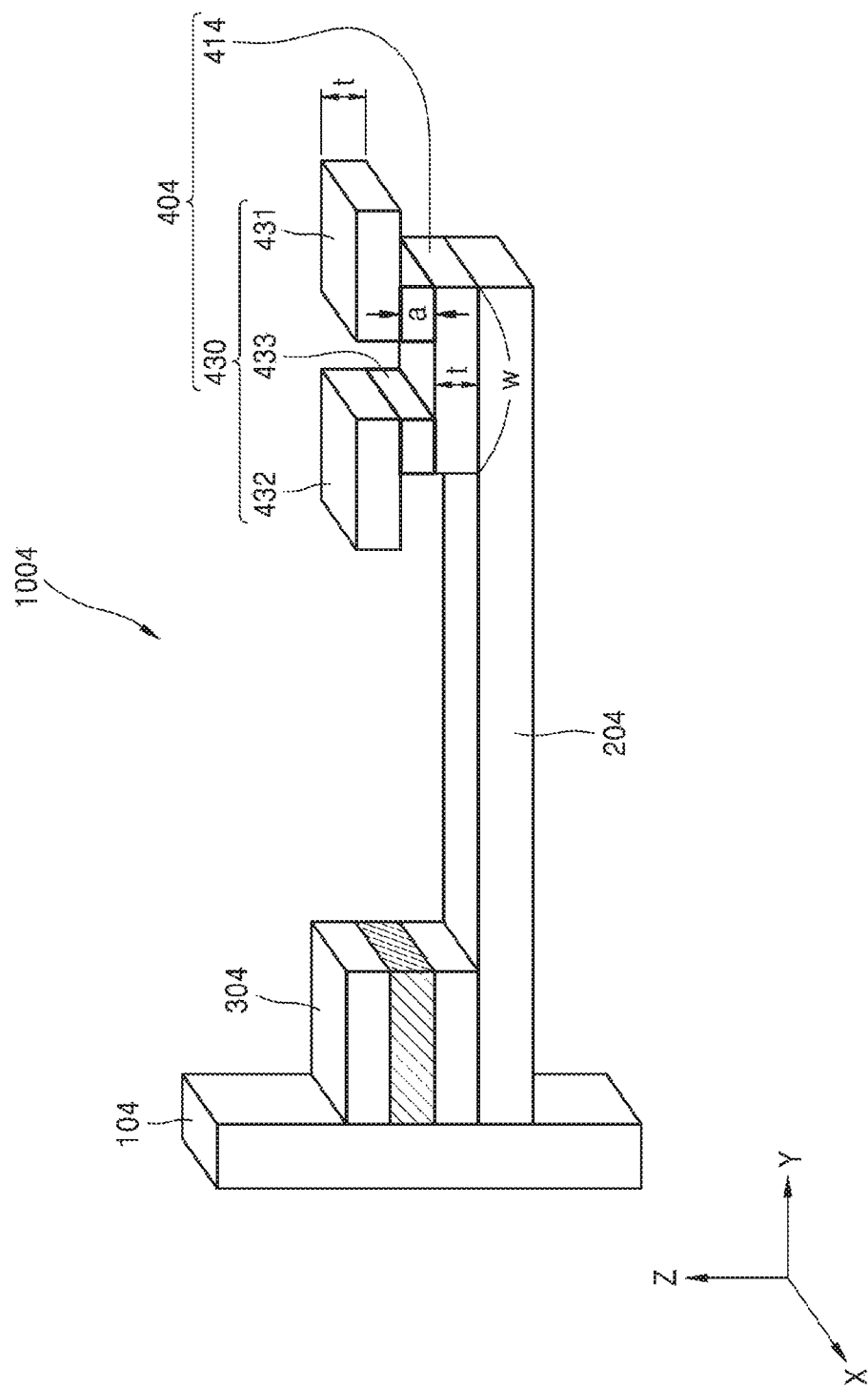
FIG. 5 is a schematic perspective view of a resonator according to an example embodiment.

FIG. 5 is a schematic perspective view of a resonator 1004 according to an example embodiment.

Referring to FIG. 5, the resonator 1004 may be similar to the resonator 1000 of FIG. 1 except for a lumped mass unit 404. The lumped mass unit 404, like the lumped mass unit 400 of FIG. 1, may include a base unit 414 that contacts a vibration beam 204 and a wing unit 430 that is arranged on the base unit 414 and is separated from the vibration beam 204. For example, the wing unit 430 may include a first wing 431 extending in a direction away from a supporting member 104 from one edge of the base unit 414 and a second wing 432 extending in a direction toward the supporting member 104 from another edge of the base unit 414. The lumped mass unit 404, unlike the lumped mass unit 400 of FIG. 1, may further include a connection unit 433 that connects the base unit 414 to the wing unit 430. A thickness a of the connection unit 433 may be varied according to the manufacturing process.

Figure 6:
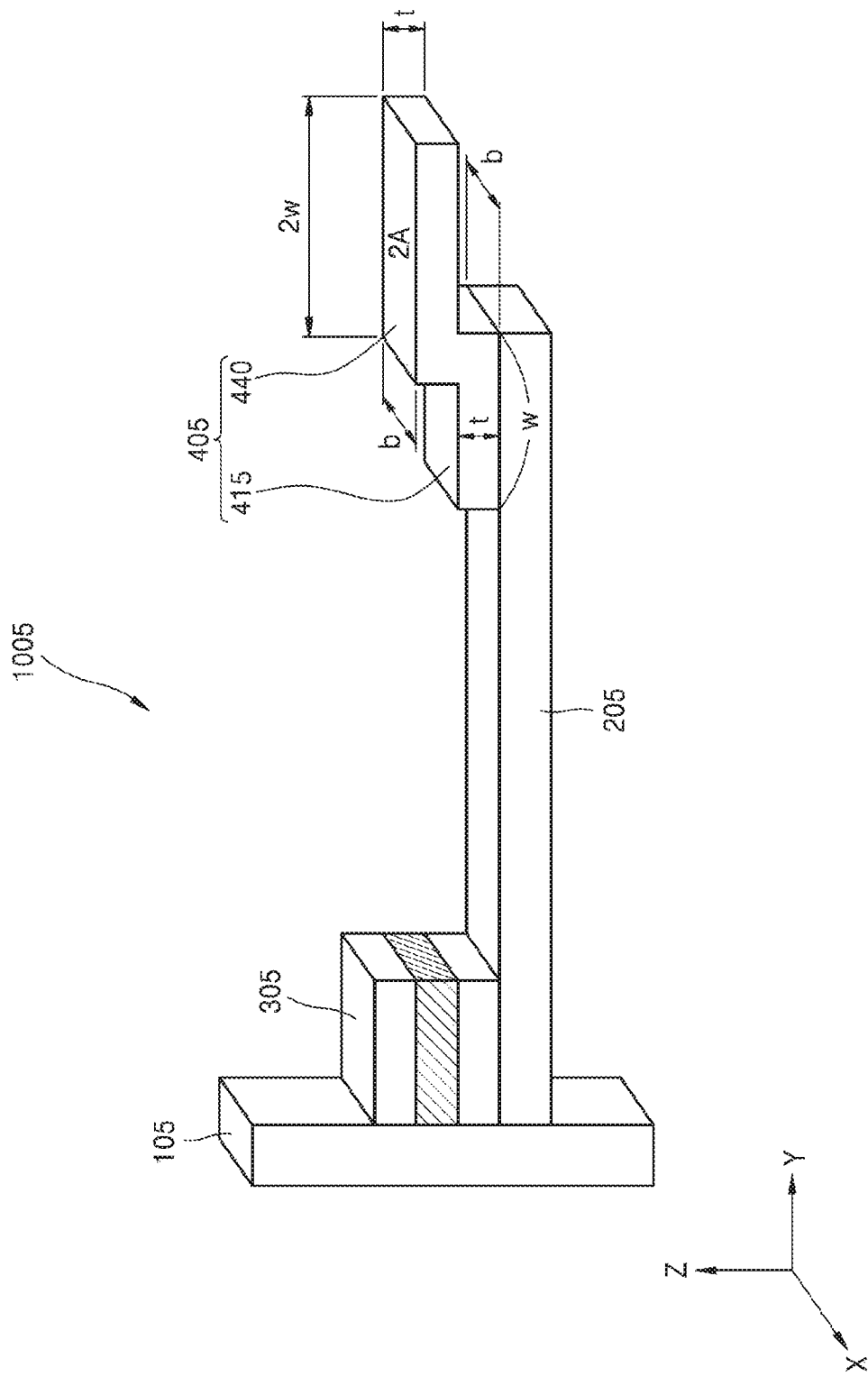
FIG. 6 is a schematic perspective view of a resonator according to an example embodiment.

FIG. 6 is a schematic perspective view of a resonator 1005 according to an example embodiment.

Referring to FIG. 6, the resonator 1005 may be similar to the resonator 1000 of FIG. 1 except for a lumped mass unit 405. The lumped mass unit 405 may include a base unit 415 and a double layer structure having a wing unit 440 arranged on the base unit 415. The wing unit 440 is arranged on the base unit 415, and thus, may be separated from a vibration beam 205. For example, the wing unit 440 may have a single wing shape extending in a direction away from a supporting member 105 from an edge of the base unit 415.

The single wing shape may have a rectangular parallelepiped shape in which a length in the first direction (the Y-axis direction as shown in FIG. 6) is 2 W, a thickness is t, and a width in the second direction (an X-axis direction) is b, wherein the second direction is perpendicular to both the first direction (the Y-axis direction) and a thickness direction (a Z-axis direction). Accordingly, a volume of the wing unit 440 may be 2·A·t. Also, a volume of the base unit 415 may be A·t, which is the same volume as the base unit 410 of FIG. 1, and accordingly, a total volume of the lumped mass unit 405 may be 3·A·t. However, the present embodiment is not limited thereto, and the length of the single wing shape in the first direction (the Y-axis direction) may be longer than 2 W, and accordingly, the total volume of the lumped mass unit 405 may be greater than 3·A·t.

In this way, when the wing unit 440 includes a single wing shape and extends farther than the first wing 421 of FIG. 1 in the first direction, an acting point of an external force that acts on the lumped mass unit 405 moves in a direction away from the supporting member 105, and thus, the torque produced in the sensing unit 305 increases. Accordingly, the sensitivity of the resonator 1005 may be increased.

Figure 7:
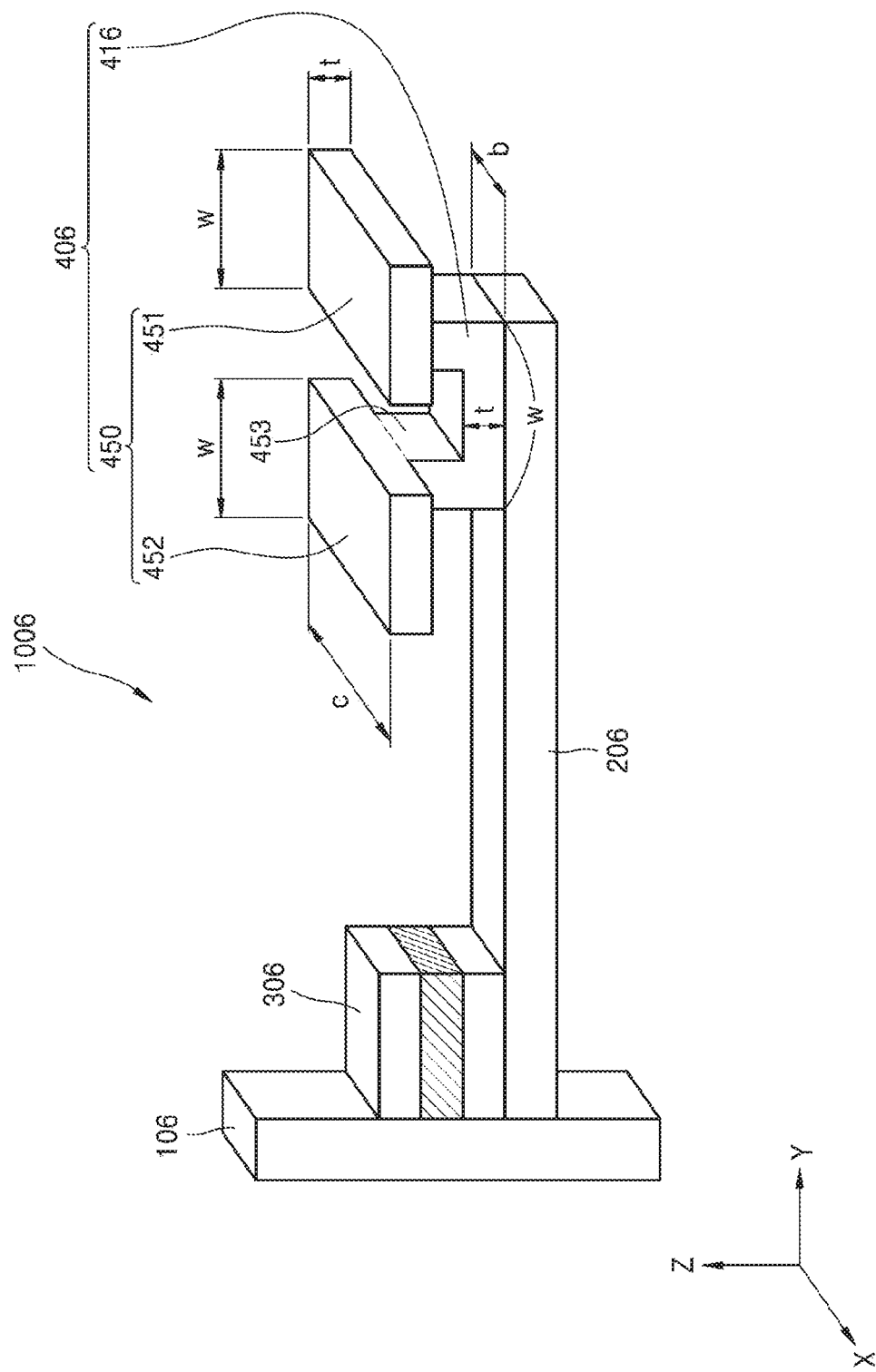
FIG. 7 is a schematic perspective view of a resonator according to an example embodiment.

FIG. 7 is a schematic perspective view of a resonator 1006 according to an example embodiment.

Referring to FIG. 7, the resonator 1006 may be equal to the resonator 1000 of FIG. 1 except for a lumped mass unit 406. The lumped mass unit 406 may have a double layer structure having a base unit 416 and a wing unit 450 arranged on the base unit 416. The wing unit 450 is arranged on the base unit 416, and thus, may have a configuration separated from a vibration beam 206. For example, the wing unit 450 may include a first wing 451 extending in a direction away from a supporting member 106 from one edge of the base unit 416 and a second wing 452 extending in a direction toward the supporting member 106 from another edge of the base unit 416. Also, the wing unit 450 and the base unit 416 may be connected by a connection unit 453.

The first wing 451 and the second wing 452 may each have a rectangular parallelepiped shape in which a length in the first direction (the Y-axis direction as shown in FIG. 7) is w and a thickness is t. A width c of the first wing 451 and the second wing 452 in the second direction (the X axis-direction) may be greater than a width b in the second direction (the X axis-direction) of the base unit 416, wherein the second direction (the X axis-direction) is perpendicular to both the first direction (the Y-axis direction) and the thickness direction (a Z-axis direction).

In this way, when the width c of the first wing 451 and the second wing 452 in the second direction (the X axis-direction) is formed greater than the width b of the first wing 421 and the second wing 422 in the second direction (the X axis-direction), a mass of the lumped mass unit 406 may be formed greater than that of the lumped mass unit 400 of FIG. 1 in a state that a deposition thickness of the lumped mass unit 406 is not increased. As a result, the resonator 1006 may have a resonant frequency lower than that of the resonator 1000 of FIG. 1 without increasing the thickness of the lumped mass unit 406 in the thickness direction (the Z axis-direction).

FIGS. 8 through 15 are schematic cross-sectional views illustrating a method of manufacturing the resonator 1000 of FIG. 1 according to an example embodiment.

Referring to FIG. 8, the sensing unit 300 may be formed on the vibration beam 200. The sensing unit 300 may be formed through a conventional semiconductor process. For example, the sensing unit 300 may be formed by patterning a metal using a photoresist layer.

Referring to FIG. 9, a first photoresist layer 10 (i.e., a photoresist layer) covering both the sensing unit 300 and the vibration beam 200 may be formed. The first photoresist layer 10 may have a thickness t.

Referring to FIG. 10, a hole H may be formed in the first photoresist layer 10 to expose a portion of the vibration beam 200 by patterning the first photoresist layer 10. Also, the hole H may have a shape in which the base unit 410 and the vibration beam 200 of FIG. 1 contact each other. In other words, the hole H may have the same cross-sectional shape as that of the base unit 410. An area of a surface EA where the base unit 410 contacts the vibration beam 200 may be A.

Referring to FIG. 11, a metal layer ML covering the first photoresist layer 10 and the hole H may be formed. The metal layer ML may have a thickness t.

Referring to FIG. 12, a second photoresist layer 20 may be formed on the metal layer ML.

Referring to FIG. 13, a portion of the metal layer ML may be exposed by patterning the second photoresist layer 20.

Referring to FIG. 14, a shape of the wing unit 420 may be formed by patterning the exposed metal layer ML. For example, the metal layer ML may be patterned by etching a portion of the metal layer ML.

Referring to FIG. 15, the first photoresist layer 10 and the second photoresist layer 20 of FIG. 14 may be removed. For example, the first photoresist layer 10 and the second photoresist layer 20 may be removed by ashing. The shape of the metal layer ML remaining on the vibration beam 200 after the first photoresist layer 10 and the second photoresist 20 are removed may be the lumped mass unit 400 including the base unit 410 and the wing unit 420.

FIGS. 16 through 23 are schematic cross-sectional views illustrating a method of manufacturing the resonator 1004 of FIG. 5 according to an example embodiment.

Referring to FIG. 16, the sensing unit 304 may be formed on the vibration beam 204. The sensing unit 304 may be formed through a conventional semiconductor process. For example, the sensing unit 304 may be formed by patterning a metal, etc. using a photoresist layer.

Referring to FIG. 17, a first photoresist layer 14 (i.e., a photoresist layer) covering the sensing unit 304 and the vibration beam 204 may be formed. The first photoresist layer 14 may have a thickness t'. The thickness t' of the first photoresist layer 14 may be greater than the thickness t of the first photoresist layer 10 of FIG. 9.

Referring to FIG. 18, a hole H that exposes a portion of the vibration beam 204 may be formed by patterning the first photoresist layer 14. Also, the hole H may have a shape in which the base unit 414 and the vibration beam 204 of FIG. 5 contact each other. In other words, the hole H may have the same cross-sectional shape as that of the base unit 414. An area of a surface EA where the base unit 414 contacts the vibration beam 204 may be A.

Referring to FIG. 19, a metal layer ML covering the first photoresist layer 14 and the hole H may be formed. A thickness of the metal layer ML may be equal to the thickness t of the metal layer ML of FIG. 11.

Referring to FIG. 20, a second photoresist layer 24 may be formed on the metal layer ML.

Referring to FIG. 21, a portion of the metal layer ML may be exposed by patterning the second photoresist layer 24.

Referring to FIG. 22, a shape of the wing unit 430 may be formed by patterning the exposed metal layer ML. For example, the metal layer ML may be patterned by etching a portion of the metal layer ML.

Referring to FIG. 23, the first photoresist layer 14 and the second photoresist layer 24 of FIG. 22 may be removed. For example, the first photoresist layer 14 and the second photoresist layer 24 may be removed by ashing. The shape of the metal layer ML remaining on the vibration beam 204 after the first photoresist layer 14 and the second photoresist 24 are removed may be the lumped mass unit 404 including the base unit 414 and the wing unit 430.

In the processes of FIGS. 16 through 23, a thickness t' of the first photoresist layer 14 may be formed greater than the thickness t of the first photoresist layer 10 of FIG. 9, and thus, the lumped mass unit 404 may further include the connection unit 433 as shown in FIG. 23.

Figure 24:
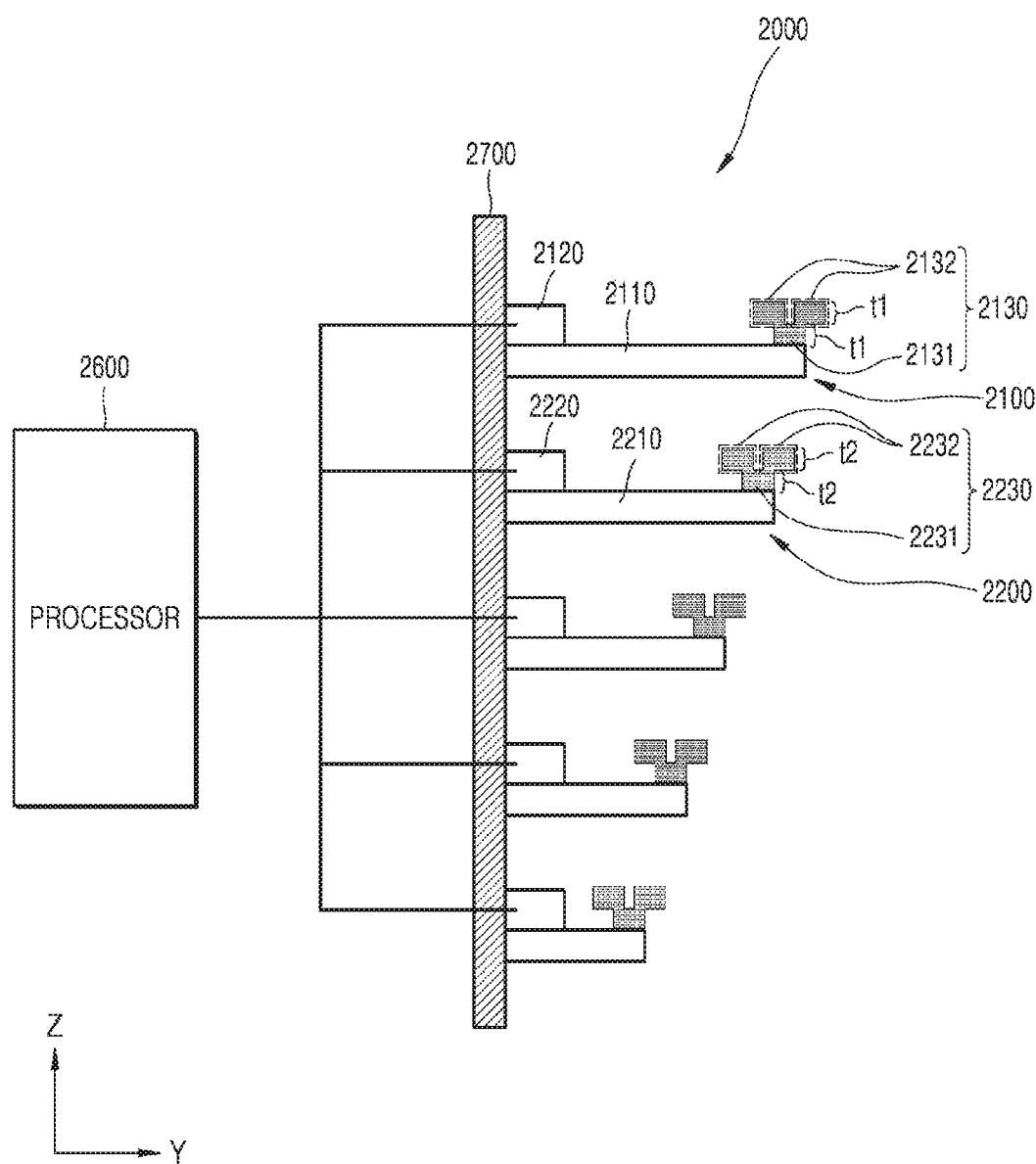
FIG. 24 is a schematic diagram of a resonator system including a plurality of resonators according to an example embodiment.

FIG. 24 is a schematic diagram of a resonator system 2000 including a plurality of resonators.

Referring to FIG. 24, the resonator system 2000 may include a plurality of resonators including a first resonator 2100 and a second resonator 2200 having a resonant frequency different from that of the first resonator 2100 and a processor 2600 that processes detected signals from the plurality of resonators including the first resonator 2100 and the second resonator 2200. Ends of each of the resonators including the first resonator 2100 and the second resonator 2200 may be fixed on a supporting member 2700.

The first resonator 2100 may include a first vibration beam 2110, a first sensing unit 2120 that detects the movement of the first vibration beam 2110, and a first lumped mass unit 2130 including a first base unit 2131 that contacts the first vibration beam 2110 and a first wing unit 2132 arranged separately from the first vibration beam 2110 on the first base unit 2131.

The second resonator 2200 may include a second vibration beam 2210, a second sensing unit 2220 that detects the movement of the second vibration beam 2210, and a second lumped mass unit 2230 including a second base unit 2231 that contacts the second vibration beam 2210 and a second wing unit 2232 arranged separately from the second vibration beam 2210 on the second base unit 2231.

For example, the first wing unit 2132 may include a wing shape extending in opposite directions away from the first base unit 2131 from opposite edges of the first base unit 2131, and the second wing unit 2232 may include a wing shape extending in opposite directions away from the second base unit 2231 from opposite edges of the second base unit 2231. Also, a thickness t1 of the first wing unit 2132 may be equal to that of the first base unit 2131. A thickness t2 of the second wing unit 2232 may be equal to that of the second base unit 2231. At this point, when the first lumped mass unit 2130 and the second lumped mass unit 2230 are manufactured through the same process, the thicknesses t1 of the first wing unit 2132 and the first base unit 2131 may be equal to the thicknesses t2 of the second wing unit 2232 and the second base unit 2231.

The first wing unit 2132 and the second wing unit 2232 may include any of the shapes of the wing units 400, 404, 405, and 406 of FIGS. 1, 5, 6, and 7. However, the present embodiment is not limited thereto, that is, the first wing unit 2132 and the second wing unit 2232 may have various shapes.

As described above, the resonant frequencies of the first resonator 2100 and the second resonator 2200 may be different from each other. For example, when lengths of the first vibration beam 2110 and the second vibration beam 2210 are different from each other, the resonant frequencies of the first resonator 2100 and the second resonator 2200 may be different from each other. Also, for example, when masses of the first lumped mass unit 2130 and the second lumped mass unit 2230 are different from each other, the resonant frequencies of the first resonator 2100 and the second resonator 2200 may be different from each other.

An equal external physical force (i.e., a sound) may be applied to each of the resonators having different resonant frequencies. For example, when a sound of a combination of various frequencies of sound waves is applied to the plurality of resonators, each of the resonators may detect a sound wave corresponding to its own resonant frequency. The processor 2600 may analyze a characteristic of a sound by synthetically processing intensities of voltages generated by the sound waves detected in each of the resonators.

Example embodiments of the present disclosure provide resonators that may reduce manufacturing cost and have a low frequency characteristic and high detecting sensitivity, a resonator system including the resonators, and methods of manufacturing the resonators.

While the embodiments of resonator, resonator system including the resonators, and methods of manufacturing the resonators have been described with reference to the figures, it will be understood by those of ordinary skill in the art that various changes in form and details may be made therein without departing from the spirit and scope of the disclosure. Accordingly, the scope of the resonators, the resonator system including the resonators, and the method of manufacturing the resonators is defined not by the detailed description of the disclosure but by the appended claims.

What is claimed is:

1. A resonator comprising:
  a vibration beam configured to vibrate in response to an external signal, an edge of the vibration beam being fixed on a supporting member, the vibration beam extending in a first direction;
  a sensing unit arranged on the vibration beam to detect movement of the vibration beam; and
  a lumped mass unit having a double layer structure in which a base unit and a wing unit are stacked sequentially, the lumped mass unit being arranged on the vibration beam,
  wherein the base unit contacts the vibration beam and
  wherein the wing unit is arranged on the base unit, the wing unit being separated from the vibration beam.

2. The resonator of claim 1, wherein the vibration beam contacts the base unit without contacting any other portion of the lumped mass unit.

3. The resonator of claim 2, wherein the wing unit and the base unit have a same thickness.

4. The resonator of claim 3, wherein a size and a shape of the wing unit are determined so that a total volume of the lumped mass unit is greater than a product of a cross-sectional area of a region of contact between the base unit and the vibration beam and the thickness of the base unit.

5. The resonator of claim 4, wherein the lumped mass unit further comprises a connection unit that connects the base unit to the wing unit.

6. The resonator of claim 4, wherein the wing unit comprises a first wing extending in the first direction from an edge of the base unit, and
  wherein a distance from an edge of the first wing to the supporting member is greater than a distance from the edge of the base unit to the supporting member.

7. The resonator of claim 6, wherein a length of the first wing in the first direction is greater than a length of the base unit in the first direction.

8. The resonator of claim 6, wherein the wing unit further comprises a second wing extending in the first direction from another edge of the base unit, and
  wherein a distance from an edge of the second wing to the supporting member is less than a distance from the another edge of the base unit to the supporting member.

9. The resonator of claim 8, wherein the first wing and the second wing have a same length in the first direction, and
  wherein the first wing, the second wing, and the base unit have a same width in a second direction perpendicular to the first direction and to a thickness direction.

10. The resonator of claim 8, wherein widths of the first wing and the second wing in a second direction are greater than a width of the base unit in the second direction, the second direction being perpendicular to the first direction and to a thickness direction.

11. The resonator of claim 1, wherein the sensing unit comprises a piezoelectric material.

12. A resonator system comprising:
  a first resonator comprising:
    a first vibration beam;
    a first sensing unit configured to detect movement of the first vibration beam; and
    a first lumped mass unit comprising a first base unit contacting the first vibration beam and a first wing unit arranged on the first base unit, the first wing unit being separated from the first vibration beam, and the first lumped mass unit having a double layer structure in which the first base unit and the first wing unit are stacked sequentially;
  a second resonator comprising:
    a second vibration beam;
    a second sensing unit configured to detect movement of the second vibration beam; and
    a second lumped mass unit comprising a second base unit contacting the second vibration beam and a second wing unit arranged on the second base unit, the second wing unit being separated from the second vibration beam, and the second lumped mass unit having a double layer structure in which the second base unit and the first wing unit are stacked sequentially; and
  a processor configured to process signals detected from the first and second resonators.

13. The resonator system of claim 12, wherein the first vibration beam and the second vibration beam have different lengths.

14. The resonator system of claim 12, wherein the first lumped mass unit and the second lumped mass unit have different masses.

15. The resonator system of claim 12, wherein
  the first wing unit comprises a first wing extending in an extension direction away from the first base unit from an edge of the first base unit, and
  the second wing unit comprises a second wing extending in the extension direction away from the second base unit from an edge of the second base unit.

16. The resonator system of claim 12, wherein the first wing unit and the first base unit have a same first thickness, and the second wing unit and the second base unit have a same second thickness.

* * * * *